(12) United States Patent
Schrodi et al.

(10) Patent No.: US 11,747,364 B2
(45) Date of Patent: Sep. 5, 2023

(54) HIGH-FREQUENCY TEST CONNECTOR DEVICE, HIGH FREQUENCY TESTING SYSTEM AND USE OF SAME

(71) Applicant: Ingun Prüfmittelbau GmbH, Constance (DE)

(72) Inventors: Thomas Schrodi, Constance (DE); Dominik Böhler, Constance (DE); Michael Neher, Constance (DE); Nebiat Awano, Constance (DE); Sergiy Royak, Radolfzell (DE); Pascal Neumann, Constance (DE)

(73) Assignee: Ingun Prüfmittelbau GmbH, Constance (DE)

( * ) Notice: Subject to any disclaimer, the term of this patent is extended or adjusted under 35 U.S.C. 154(b) by 186 days.

(21) Appl. No.: 16/772,864

(22) PCT Filed: Oct. 22, 2018

(86) PCT No.: PCT/EP2018/078908
§ 371 (c)(1),
(2) Date: Jun. 15, 2020

(87) PCT Pub. No.: WO2019/115071
PCT Pub. Date: Jun. 20, 2019

(65) Prior Publication Data
US 2021/0165020 A1    Jun. 3, 2021

(30) Foreign Application Priority Data
Dec. 14, 2017 (DE) ..................... 10 2017 130 015.5

(51) Int. Cl.
*G01R 1/067* (2006.01)
*H01R 13/24* (2006.01)
(Continued)

(52) U.S. Cl.
CPC ...... *G01R 1/06772* (2013.01); *G01R 1/06722* (2013.01); *G01R 1/06733* (2013.01); *H01R 13/2421* (2013.01); *H01R 13/2457* (2013.01); *H01R 24/40* (2013.01); *H01R 2103/00* (2013.01); *H01R 2201/20* (2013.01)

(58) Field of Classification Search
CPC ............ G01R 1/06772; G01R 1/06722; G01R 1/06733; H01R 13/2421; H01R 13/2457; H01R 24/40; H01R 2201/20
See application file for complete search history.

(56) References Cited

U.S. PATENT DOCUMENTS

| | | | | |
|---|---|---|---|---|
| 4,697,859 A | * | 10/1987 | Fisher, Jr. | .......... H01R 13/6315 439/246 |
| 5,746,617 A | * | 5/1998 | Porter, Jr. | .......... H01R 13/6315 439/248 |

(Continued)

FOREIGN PATENT DOCUMENTS

| CN | 1645686 A | 7/2005 |
|---|---|---|
| CN | 202872128 U | 4/2013 |

(Continued)

OTHER PUBLICATIONS

International search report for patent application No. PCT/EP2018/078908 dated Feb. 6, 2019.

*Primary Examiner* — Paresh Patel
(74) *Attorney, Agent, or Firm* — Bachman & LaPointe, P.C.

(57) ABSTRACT

The invention relates to a high-frequency test connector device (12; 12') having an adapter housing including a sleeve-like ground contact section (10; 10') axially at one end, (18) at the other end, and centrally an insulated inner contact (20), wherein the ground contact section has an electrically conducting spring member (26; 26', 28; 42, 44; 44', 46) for ground contact, associated such that for engaging over the sleeve section (14) of the contacting partner (16), the latter with an end face (30), to form a contact and (Continued)

resiliently along the movement or connecting longitudinal axis, can engage on the spring member (26) formed in a sleeve base of the ground contact section (10), or wherein, for engaging in the sleeve section (14') of the connecting partner (16'), the spring member (26') projects from an end face end section of the ground contact section (10'), to form a contact and resiliently along the longitudinal axis, can engage on a ground-conducting inner section (40) of the connecting partner.

10 Claims, 2 Drawing Sheets

(51) Int. Cl.
 *H01R 24/40* (2011.01)
 *H01R 103/00* (2006.01)

(56) References Cited

U.S. PATENT DOCUMENTS

| | | | |
|---|---|---|---|
| 6,113,410 A * | 9/2000 | Heit | H01R 9/0503 439/321 |
| 6,383,031 B1 | 5/2002 | Law et al. | |
| 7,347,727 B2 | 3/2008 | Wlos et al. | |
| 2005/0164552 A1 | 7/2005 | Wlos et al. | |
| 2007/0004238 A1 | 1/2007 | Breinlinger et al. | |
| 2007/0197099 A1 | 8/2007 | DiStefano | |
| 2012/0129375 A1 * | 5/2012 | Van Swearingen | H01R 9/05 439/314 |
| 2013/0115809 A1 | 5/2013 | Hanson et al. | |
| 2013/0171868 A1 | 7/2013 | Gessford et al. | |
| 2015/0280370 A1 | 10/2015 | Huang et al. | |

FOREIGN PATENT DOCUMENTS

| | | |
|---|---|---|
| CN | 103199388 A | 7/2013 |
| CN | 104051885 A | 9/2014 |
| CN | 206313241 U | 7/2017 |
| CN | 107251332 A | 10/2017 |
| DE | 3734667 C1 | 3/1989 |
| DE | 4107714 C1 | 7/1992 |
| DE | 202010007227 U1 | 10/2010 |
| DE | 202010007229 U1 | 10/2010 |
| GB | 2336948 A | 11/1999 |
| JP | 2001297840 A | 10/2001 |
| JP | 2013140795 A | 7/2013 |
| WO | 2012041578 A1 | 4/2012 |

* cited by examiner

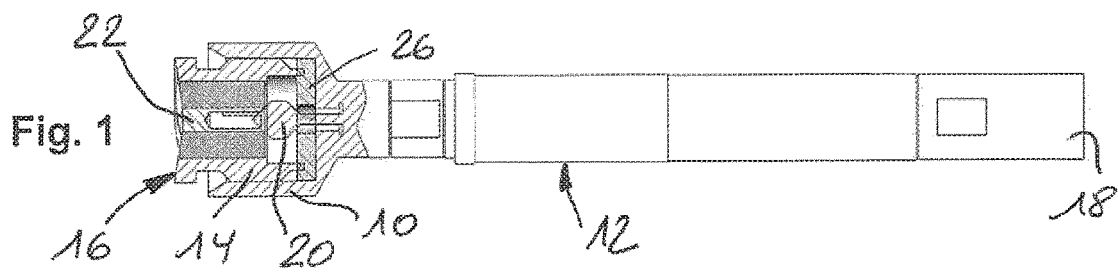
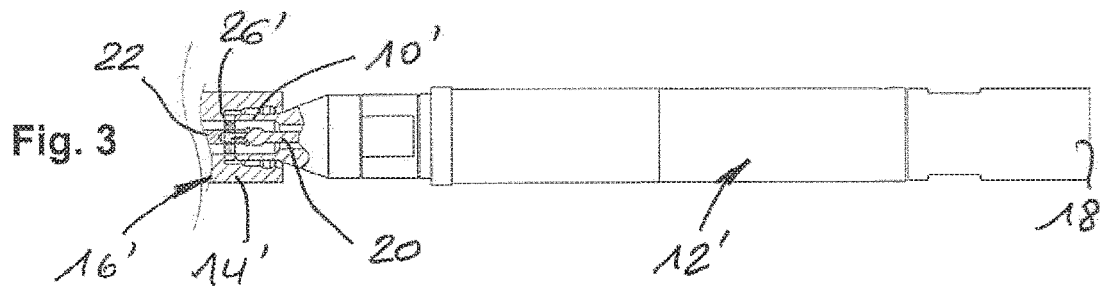
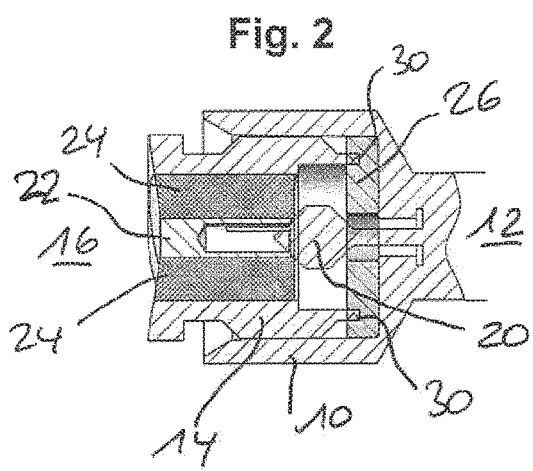
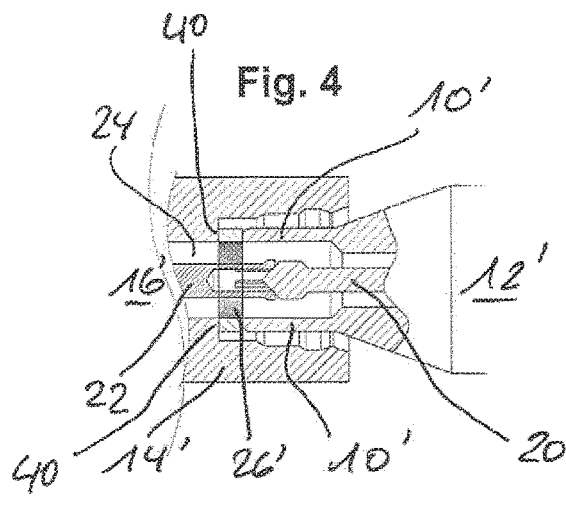
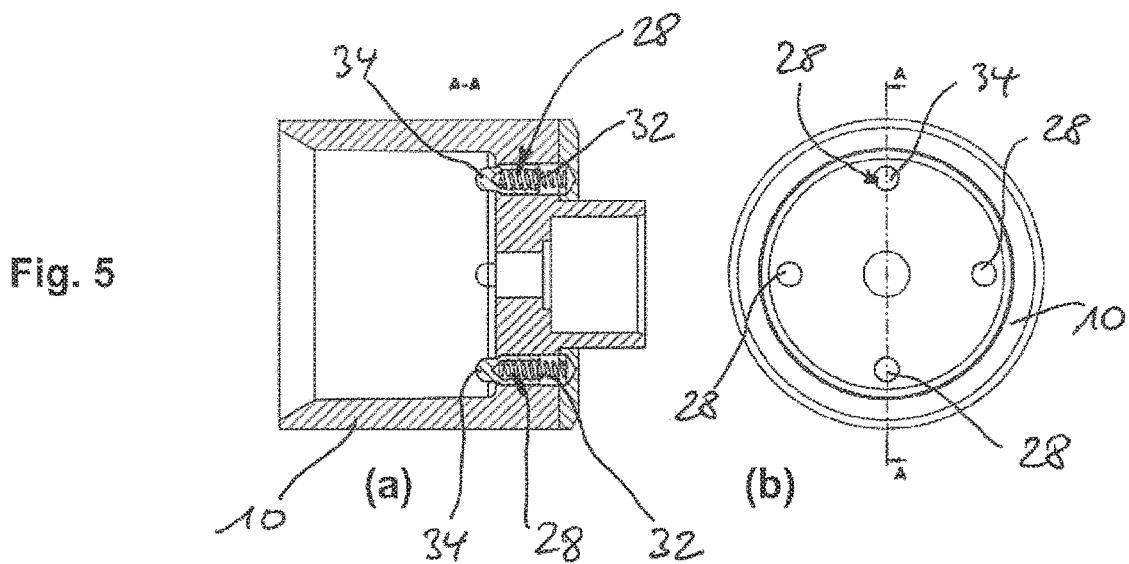

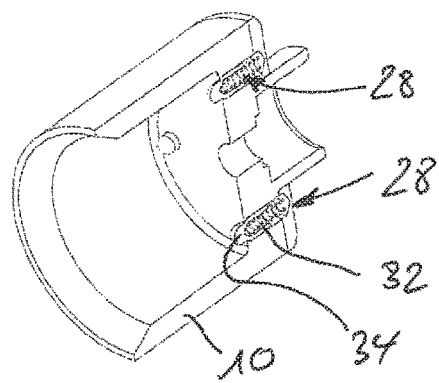
Fig. 6
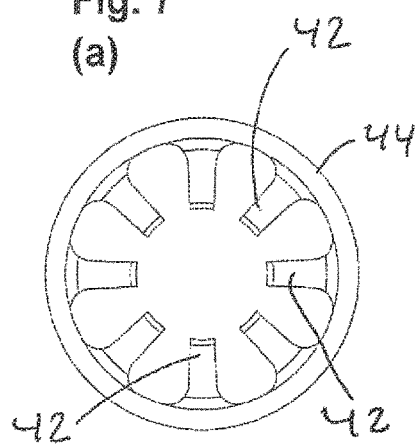
Fig. 7 (a)
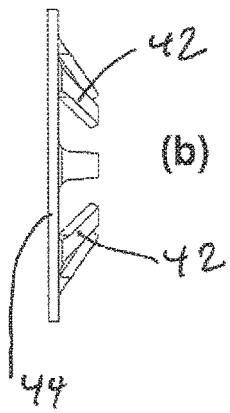
(b)
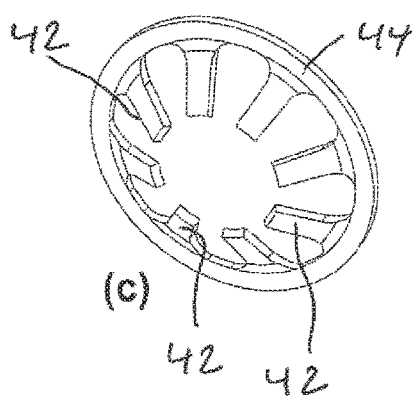
(c)
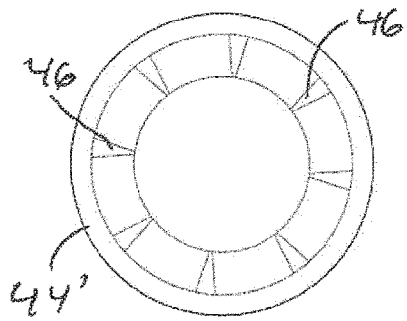
Fig. 8 (a)
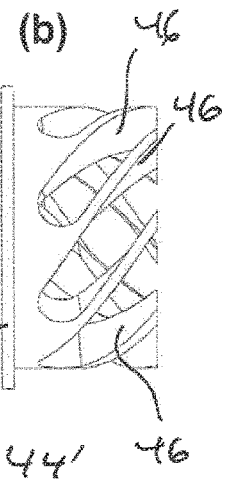
(b)
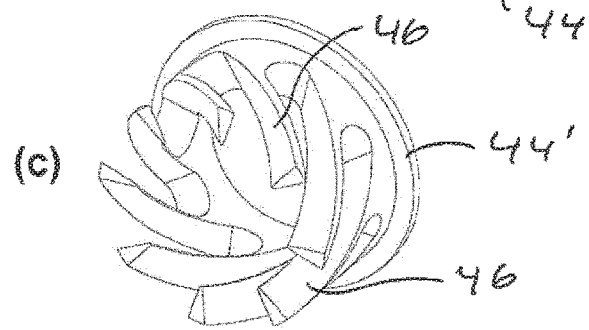
(c)

HIGH-FREQUENCY TEST CONNECTOR DEVICE, HIGH FREQUENCY TESTING SYSTEM AND USE OF SAME

BACKGROUND OF THE INVENTION

The present invention relates to a high-frequency test connector device. Furthermore, the present invention relates to a high-frequency test system employing such a high-frequency test connector device, and the present invention relates to a use of such a high-frequency test connector device and/or of such a high-frequency test system.

A high-frequency test connector device is known from the applicant's DE 20 2010 007 227 U1. A high-frequency test pen disclosed there as a generic high-frequency test connector device is intended and configured for temporary function-testing contact with a coaxial connection partner (contact partner) connected to electronics to be tested at typical test and operating frequencies above 1 GHz, a generic high-frequency test connector device (high-frequency test pen) of this kind being realized by means of an inner conductor and a sleeve-like outer conductor coaxial thereto for being placed on the contact partner in such a manner that the face of the (annular) outer edge of the outer conductor engages onto the correspondingly annular outer contact of the contact partner and the inner conductor (which is typically oriented axially, i.e., along the axis of movement and connection) can touch the center contact of the contact partner in a spring-loaded manner. Once such a temporary test connection contact has been established, mobile radio modules or similar technology typically designed for mass production is tested in the indicated high-frequency range.

The disadvantageous effect that, in the industrial testing and manufacturing practice, the coaxial high-frequency connection partner (contact partner) has a machine-made and typically mass-produced inner and outer contact structure in which the (plastic) isolator needed between the inner and outer conductors is not fully accurate to dimension could already be observed in the generic state of the art. This had the disadvantageous effect that this isolating material extends beyond an end-side edge of the outer contact in the axial direction with the result that a frontally engaging outer conductor of a generic test pen was not able to establish contact with the metallic outer contact of the partner. Measurement and signal transmission issues during testing were the disadvantageous consequence.

DE 20 2010 007 227 U1, which is referenced as state of the art, has overcome this disadvantage through the high-frequency test connector device forming a receiving space between the (grounding and sleeve-like) ground contact portion and the inner contact into which the outer sleeve portion of the coaxial connection partner can be introduced or inserted; in an inserted state, the inner contact of the generic test connector device will engage onto the inner conductor portion of the connection (contact) partner, thus establishing contact and enabling the measuring operation.

The technology known from DE 20 2010 007 227 U1 already provides jacket-side tolerance compensation between the (radially outer) ground contact portion of the test connector device and the sleeve portion of the connection partner for establishing ground contact, namely through a (typically hollow cylindrical) inner wall of the ground contact portion having an annular spring which can establish contact with the outer jacket surface of the connection partner by spreading and establishing contact, thus ensuring reliable establishment of ground contact of the respective coaxial outer conductors.

In practical operation, however, this technology known from DE 20 2010 007 227 U1 has also proven to be in need of improvement. For instance, the amount of production technology, construction and components required for the contact solution by means of a jacket-side annular spring is immense-a part of such a small size which is suitable for being inserted into an annular slot (annular groove) formed on the inner surface of the ground contact portion does not only require complex and specialized productions steps, but such a sufficiently fitting annular spring is also costly and is additionally prone to relatively heavy wear, which means that an effective test lifetime (or a maximum number of test cycles in the form of respective connection processes with the connection partner) is limited in addition to production being complex (and potentially costly).

Moreover, practical experience with the known technology has shown with regard to the high-frequency transmission properties of the high-frequency connection thus made possible by means of the ground contact that inhomogeneities occur in the high-frequency transition resistances or in the (frequency-dependent) damping behavior, in particular at test and operating frequencies above 1 GHz; as an additional disadvantage, high-frequency transmission issues of this kind were not systematically limited to the same frequency ranges. This additionally leads to high complexity in quality control and in the production of generic test connector devices (or test systems to be constructed based on them), which has an additional disadvantageous effect on total production costs.

SUMMARY OF THE INVENTION

Hence, the object of the present invention is both to improve a high-frequency test connector device with regard to production and use properties that are cost-efficient, capable of automation and promise a long service life (including an improved number of test cycles) and to provide a device of this kind which is improved in terms of its high-frequency transmission properties, in particular with respect to operating and test frequencies above 1 GHz, and which in particular does not exhibit any transmission and damping properties that are inhomogeneous in this regard or fluctuate in certain (frequency) ranges.

The object is attained by the high-frequency test connector device having the features disclosed herein; advantageous embodiments of the invention are also described herein and in the dependent claims. Additional protection within the scope of the invention is sought for the use of the high-frequency test connector device according to the invention in connection with a high-frequency test system, and protection in the scope of the invention is sought for a use of the high-frequency test connector device and of the high-frequency test system in an operating and/or test frequency range above 1 GHz, in particular between 2 GHz and 6 GHz.

In an advantageous manner according to the invention, the invention now effects end-side or front-side tolerance compensation between the coaxial measuring partners, i.e., the ground contact portion of the high-frequency test connector device according to the invention and the outer conductor (sleeve portion) of the connection partner. While this does not mean that an annular spring or a similar jacket-side spring assembly according to DE 20 2010 007 227 U1 cannot be used additionally, the present invention has advantageously shown that this is not necessary in high-frequency transmission or with regard to homogeneous damping properties across wide frequency ranges in the range above 1 GHz, which is particularly relevant at hand.

Instead, the present invention allows axially front-side tolerance compensation that is effective in a transmission-optimized manner in the indicated way to be ensured in a particularly advantageous manner and for both of the possible variations of the contact-establishing and function-testing interaction between the coaxial test connector device and the coaxial connection partner, namely for the engagement of the ground contact portion over the radial outside of the sleeve portion of the connection partner (thus analogous to the design of the generic state of the art according to DE 20 2010 007 227 U1) and, radially vice-versa, for the engagement of the ground contact portion into a radially outer ground-sleeve portion of the connection partner.

According to the first variation of the invention, this advantageously happens according to the invention through the ground contact portion of the high-frequency test connector device according to the invention having electrically conducting spring means for establishing ground contact (with the connection partner, more precisely its sleeve portion) that are assigned in such a manner that for the engagement over the sleeve portion of the connection partner, an end-side face of the latter can engage onto the spring means, which are realized in a sleeve bottom of the ground contact portion, in a contact-establishing manner and in a spring-loaded manner along the axis of movement and connection. In other words, the electrically conducting spring means according to the invention are disposed in an axial end portion of the ground contact portion, i.e., its sleeve bottom or a bottom of the receiving space enclosed by the ground contact portion, for this variation of the solution.

In the alternative configuration of the invention, the ground contact portion has the electrically conducting spring means according to the invention for establishing ground contact which are assigned in such a manner that for the engagement into the sleeve portion of the connection partner, the spring means, which protrude from a front-side end portion of the ground contact portion, can engage onto a grounding inner portion of the connection partner in a contact-establishing manner and in a spring-loaded manner along the axis of movement and connection; in a particularly preferred configuration, the grounding inner portion of the connection partner can be realized as an inner (further preferably bottom-side) inner shoulder of the connection partner.

In both cases, the electrically conducting spring means according to the invention ensure a ground contact which significantly improves the transmission and damping properties of the thus produced ground coupling and which is in particular also unaffected by (front-side) dimensional tolerances or other inhomogeneities, in particular those of the connection partner.

According to preferred embodiments of the invention, the electrically conducting spring means according to the invention may be realized as a plurality of individual spring pins which are attached to the respective areas of assignment or installation of the ground contact portion (typically by being inserted into suitable bores forming a receiving fit for respective ones of the individual spring pins or, alternatively, by being realized as spring-loaded plungers for being inserted into the bores) in a (preferably even) circumferential distribution. In the case of the first variation of the invention, the individual spring pins would be disposed in a circumferential distribution in the bottom or sleeve bottom of the receiving space for the connection partner, the receiving space being formed by the ground contact portion; in the case of the ground contact portion engaging into the sleeve portion of the connection partner, they would be disposed on its end-side or front-side face.

According to other preferred embodiments of the invention, it has proven as additionally advantageous and preferred for a number of provided individual spring pins, of which a plurality is to be provided according to the invention (and which themselves, in turn, form a plunger spring-loaded and axially mobile relative to a stationary sleeve in an otherwise known manner), to be at least four, further preferably at least six, in order to ensure the (tolerance-compensating) establishment of ground contact with the connection partner across preferably an entire circumference of the ground contact portion. According to an additional embodiment, it is advantageous for the quality of the contact if the contact heads of these spring pins (which is provided on one side of a spring-loaded and mobile plunger) are provided with a plane or alternatively profiled (e.g., convexly rounded), tapering and/or pointed contour.

Additionally advantageously, individual spring pins standardized for this solution or already always at hand as mass-produced parts can be used for this solution, allowing high connection quality and transmission quality to be combined with low costs.

The same applies to the option provided by an alternative embodiment, according to which the electrically conducting spring means according to the invention are configured as a (preferably annular) contact leg module. Said contact leg module has a plurality of circumferentially disposed fin-like contact legs whose respective free end portions can engage onto the respective ground contact portion of the connection partner in a spring-loaded and contact-establishing manner according to the invention, the contact legs preferably overlapping each other or being oriented so as to overlap each other at an angle or, alternatively, being oriented radially inward.

Further preferably, the number of said fin-like contact legs provided is at least four, preferably at least six, and the fin-like contact legs are preferably distributed at even intervals across the circumference; it has proven advantageous for such a contact leg module to be crown-like and to be produced by etching and bending or die-cutting and bending or, alternatively, by milling.

Again, the plurality of fin-like contact legs allows (end-side) ground contact to be established basically continuously along the entire circumference, meaning that frequency characteristics and a damping effect in transmission optimized in terms of the high-frequency transmission properties can be ensured in this way.

In possible connection with the embodiment of the contact leg module as electrically conducting spring means as described above, or alternatively without it, another embodiment of the invention intends for the spring means according to the invention to be configured as an electrically conductive metallic and/or polymeric (and preferably elastomeric) cushion and/or sponge module. In this way, the desired tolerance-compensating ground contact advantageous for damping properties is established in a particularly elegant way through the inherent elasticity in combination with the electrical conductivity of such a cushion and/or sponge module.

Thus, the present invention is particularly suitable for realizing a high-frequency test system, further preferably for operating and test frequencies above 1 GHz, and further preferably between 2 GHz and 6 GHz, and thus further and additionally preferably for testing devices of mobile phone technology, the high-frequency test connector device according to the invention being connected to a high-frequency test unit suitably configured for the desired test purpose in connection with such a system, means for establishing electrical contact with the high-frequency test connector device engaging said high-frequency test unit. This assembly as a system then interacts with a coaxial high-frequency connector module as connection partners, which, as part of a shared circuit board, for example, or high-frequency connected in another manner, have the high-frequency electronic components to be tested in the form of isolated parts, as circuit parts or as a complete electronic circuit.

While the term "high frequency" as used in the context of the invention particularly preferably refers to test and/or operation frequencies above 1 GHz and further preferably to a range of 2 GHz to 6 GHz, the present invention is not limited to this range. In fact, the present invention is suitable for any type of high-frequency ground coupling between coaxial partners in which one is a test connector device and another one is a test object as a connection partner in which the (often unavoidable) production and dimensional tolerances of the connection partner, in particular, may have disadvantageous effects on a high-frequency connection quality.

BRIEF DESCRIPTION OF THE DRAWINGS

Other advantages, features and details of the invention are apparent from the following description of preferred embodiments and from the drawings, in which FIG. 1 is a partially longitudinally cut side view of the high-frequency test connector device according to a first embodiment of the invention, illustrating a first principle of the invention, according to which a ground contact portion engages over a sleeve portion of the connection partner;

FIG. 2 is an enlarged longitudinal-section detail view of the contact-establishing head portion in the embodiment example of FIG. 2;

FIG. 3 shows an embodiment example illustrating an alternative solution principle according to the invention, which differs from the illustration of FIG. 1 in that the ground contact portion engages into the sleeve portion of the connection partner;

FIG. 4 is an enlarged longitudinal-section detail view of the connection area in the embodiment example of FIG. 3;

FIG. 5 shows views of an embodiment example according to the invention for realizing the electrically conducting spring means by means of spring pins in sub-figures (a) and (b), detailed figure (a), which is equivalent to FIG. 2, showing a longitudinal-section view cut along line A-A in the front view of sub-figure (b);

FIG. 6 is a perspective view of the connection area of the embodiment example of FIG. 5 cut in half;

FIG. 7 shows views illustrating an annular contact leg module realizing the electrically conducting spring means and comprising contact legs extending radially inward from a ring support in sub-figures (a) to (c); and FIG. 8 shows views of a configuration of the electrically conducting spring means as a crown-like metal module in which fin-type contact legs overlap each other in sections along the ring support in sub-figures (a) to (c).

DETAILED DESCRIPTION

The embodiment example of FIG. 1 illustrates a first principle of the invention, according to which a hollow cylindrical ground contact portion 10 of a high-frequency test connector device 12 is provided and configured to engage over the outside or jacket of an (equally grounding) sleeve portion 14 of a contact partner realized as a coaxial socket 16. More precisely, for coaxial production of a temporary test contact limited to a test or measuring process, the hollow cylindrical ground contact portion shown in the first embodiment example of FIG. 1 (and enlarged in FIG. 2) is a pin of an elongate coaxial test connector 12, an end 18 of which located opposite the contact portion can be connected to a high-frequency contact means (leading to suitable test means), such as a coaxial cable, in an otherwise known manner. An inner structure of the elongate pen assembly of FIG. 1 between the contact area formed by ground contact portion 10 and opposite connection 18 can be configured in the usual and coaxial way (and additionally have suitable springs); as an example only, reference is made to the pen structure according to DE 20 2010 007 227 U1, which can be equally adapted for the configuration of the intermediate area (which may analogously also apply to the embodiment example of FIG. 3).

Furthermore, the section views of FIG. 1 and FIG. 2 illustrate how an inner contact 20 which is centrically enclosed by ground contact portion 10 (and isolated therefrom and axially spring-loaded itself) can engage onto a suitably configured coaxial inner contact portion 22 of connection partner 16 (which, in turn, is isolated from ground contact 14 of the partner by depicted isolation 24).

Schematically illustrated and shaded module 26 in FIG. 1 and FIG. 2 schematically illustrates electrically conducting spring means of the first principle of the invention, namely spring means disposed in the sleeve bottom of ground contact portion 10 in the case of FIG. 1 (FIG. 2).

Said electrically conducting spring means 26 can be realized as a plurality of (in this case 4) individual spring pins 28, for example, as shown in the detail view of FIG. 5 including sub-figures (a) and (b) and in the perspective view of FIG. 6, individual spring pins 28 being evenly distributed across the circumference in the sleeve bottom of ground contact portion 28 and being configured to engage onto a front-side face 30 (which is annular in the case at hand) (FIG. 2) of the connection partner.

More precisely, said spring pins are provided with compression coil springs 32 which push a contact head 34 of the respective spring pin, which has a calotte-like contour in the case at hand, onto ring surface 30 of connection partner 16 to establish ground contact while ensuring the best tolerance compensation possible, high contact quality and low wear.

By way of the other embodiment example, the illustrations of FIG. 3 and FIG. 4 illustrate a solution principle according to the invention that is an alternative to the principle of FIG. 1 and FIG. 2; in the embodiment example of FIG. 3 and FIG. 4, ground contact portion 10' is located radially inside (relative to ground contact portion 14' of the contact partner, which surrounds ground contact portion 10' in the test state or contact state), whereas inner contact 20 of alternative high-frequency test connector device 12' according to FIG. 3 and FIG. 4 meets assigned and associated coaxial inner contact 22 of the partner in said test or connection state. In this embodiment example, the electrically conducting spring means are configured for establishing ground contact at the front end of ground contact portion 10'. As schematically shown and symbolized by grey module 26' (FIG. 4), the electrically conducting spring means, which are again realized as a plurality of individual spring pins distributed (preferably evenly) across the circumference in analogy to the illustration of FIG. 5 and FIG. 6, are provided in the front end of the (cylindrical) ground contact portion, which allows them to engage onto a grounding inner portion 40 (which is realized as an annular shoulder in the bottom of sleeve portion 14' of connection partner 16') in a tolerance-compensating, spring-loaded and contact-reliable manner as per the invention.

FIGS. 7 and 8 show options for realizing the electrically conducting spring means alternative to the spring pins, again with suitability for both variations of the invention (the variation of FIG. 1 and FIG. 2 and the variation of FIG. 3 and FIG. 4).

For instance, the embodiment example of FIG. 7 discloses a configuration of these electrically conducting spring means according to the invention as an annular contact leg module in which respective free end portions of a plurality of eight finlike contact legs protrude obliquely radially inward from a ring support 44 ("radially" also being supposed to be interpreted as a vectorial radial component within the meaning of the invention, such as in the example of FIG. 7). In this embodiment example, the assembly is realized in one piece as a suitable die-cut and bent part and has spring properties for providing ground contact.

An alternative embodiment of a crown-like realization of this kind of electrically conducting spring means (and again suitable for realizing both conceptually depicted module 26 and module 26') according to the invention is shown in the embodiment example of FIG. 8 by way of multiple views. In this case, multiple (again a plurality of eight) contact legs (again distributed circumferentially), which are realized as a milled part, extend from a ring support 44' and (axially) overlap in sections along the ring support as shown in the views of FIG. 8, their respective free leg ends thus offering an annular series of contact points for the tolerance-compensating establishment of ground contact according to the invention as contact legs 46 are about flush with the annular support portion 44' but disposed at an axial distance thereto.

The shown embodiment examples are of a merely exemplary nature; for instance, it is in particular also possible and envisaged by the invention for the modules of FIG. 7 or 8 to be supplemented (or even replaced) with foam-like and/or cushion-like elastic bodies, again with the solution of a tolerance-compensating establishment of ground contact between the contact partners according to the invention in mind.

The invention claimed is:

1. A high-frequency test connector device (12; 12') for severable, high-frequency contact-establishing and function-testing interaction with a connection partner (16; 16') in the form of a coaxial high-frequency connector module, having a sleeve portion (14; 14') on the outside relative to an inner conductor portion (22), the device (12; 12') comprising
an at least partially sleeve-like adapter housing for being joined with the connection partner manually or by machine along a longitudinal axis of movement and connection,
the adapter housing having a sleeve-like ground contact portion (10; 10') on one axial end for engaging over the sleeve portion of the connection partner in a centering and sliding manner to establish ground contact with the connection partner,
means for establishing external high-frequency signal contact (18), on the other end,
and, centrically in the ground contact portion, an inner contact (20) guided coaxially to the axis of movement and connection, wherein
the ground contact portion has electrically conducting spring means (26; 26', 28; 42, 44; 44', 46) for establishing ground contact which are assigned in such a manner that for the engagement over the sleeve portion (14) of the connection partner (16), an end-side face (30) of the latter can engage onto the spring means (26), which are formed in a sleeve bottom of the ground contact portion (10), in a contact-establishing manner and in a spring-loaded manner along the axis of movement and connection; and
wherein the spring means are realized as a plurality of individual spring pins (28), each spring pin (28) being able to establish ground contact with the connection partner by being spring-loaded along a pin spring axis parallel to the longitudinal axis of movement and connection.

2. The device according to claim 1, wherein the number of spring pins is at least four.

3. The device according to claim 1, wherein at least one of the spring pins has a contact head (34) which is profiled and/or at least partially tapering and/or pointed in the direction of the connection partner.

4. A high-frequency test system having the high-frequency test connector device according to claim 1, an electronic high-frequency test unit connected or connectable to the means for establishing external contact and, as a connection partner, at least one coaxial high-frequency connector module provided with or connected to high-frequency electronic components to be tested.

5. A method for severable, high-frequency contact-establishing and function-testing interaction with a connection partner (16; 16') in the form of a coaxial high-frequency connector module and the high-frequency test connector device according to claim 1, comprising operating the test connector device in an operating and/or test frequency range above 1 GHz.

6. The method of claim 5, wherein the operating and/or test frequency range is between 2 GHz and 6 GHz.

7. The device according to claim 1, wherein the coaxial high-frequency connector module is a coaxial high-frequency connector socket.

8. The device according to claim 1, wherein the means for establishing external high-frequency signal contact (18) is a high-frequency connection portion or a high-frequency connection cable.

9. The device according to claim 1, wherein the inner contact (20) is guided in a spring-loaded manner and isolated from the ground contact portion (10; 10').

10. The device according to claim 1, wherein the plurality of individual spring pins (28) are distributed evenly across the circumference.

* * * * *